(12) United States Patent
Zhang et al.

(10) Patent No.: US 9,159,610 B2
(45) Date of Patent: Oct. 13, 2015

(54) HYBRID MANGANESE AND MANGANESE NITRIDE BARRIERS FOR BACK-END-OF-LINE METALLIZATION AND METHODS FOR FABRICATING THE SAME

(71) Applicant: GLOBALFOUNDRIES, Inc., Grand Cayman (KY)

(72) Inventors: Xunyuan Zhang, Albany, NY (US); Moosung Chae, Englewood Cliffs, NJ (US); Larry Zhao, Niskayuna, NY (US)

(73) Assignee: GLOBALFOUNDIRES, INC., Grand Cayman (KY)

( * ) Notice: Subject to any disclaimer, the term of this patent is extended or adjusted under 35 U.S.C. 154(b) by 43 days.

(21) Appl. No.: 14/061,319

(22) Filed: Oct. 23, 2013

(65) Prior Publication Data

US 2015/0108647 A1 Apr. 23, 2015

(51) Int. Cl.
*H01L 21/4763* (2006.01)
*H01L 21/768* (2006.01)
*H01L 23/532* (2006.01)

(52) U.S. Cl.
CPC .... *H01L 21/76858* (2013.01); *H01L 21/76846* (2013.01); *H01L 21/76856* (2013.01); *H01L 23/53238* (2013.01)

(58) Field of Classification Search
CPC ............ H01L 29/6659; H01L 29/7833; H01L 21/76843; H01L 21/76846; H01L 23/53209; H01L 21/76883; H01L 21/76895; H01L 21/76858; H01L 23/53238; H01L 21/76856
USPC .......... 257/751, 288, 774; 438/627, 628, 618, 438/623, 631
See application file for complete search history.

(56) References Cited

U.S. PATENT DOCUMENTS

| | | | |
|---|---|---|---|
| 6,653,209 B1 * | 11/2003 | Yamagata | 438/459 |
| 8,357,610 B2 | 1/2013 | Feustel et al. | |
| 2009/0243116 A1 | 10/2009 | Feustel et al. | |
| 2010/0207177 A1 * | 8/2010 | Liu et al. | 257/288 |
| 2011/0163062 A1 * | 7/2011 | Gordon et al. | 216/13 |
| 2013/0130498 A1 | 5/2013 | Feustel et al. | |

OTHER PUBLICATIONS

"Selective Chemical Vapor Deposition of Manganese Self-Aligned Capping Layer for Cu Interconnections in Microelectronics", Journal of The Electrochemical Society, 157 (6) D341-D345, (2010).

* cited by examiner

*Primary Examiner* — David Vu
(74) *Attorney, Agent, or Firm* — Ingrassia Fisher & Lorenz, P.C.

(57) ABSTRACT

A method for fabricating an integrated circuit includes providing a conductive material overlying a semiconductor substrate and a dielectric material overlying the conductive material, wherein an opening exposes a surface of the conductive material and sidewalls of the dielectric material and selectively depositing a first layer of a first barrier material on the surface of the conductive material with the sidewalls of the dielectric material remaining exposed, the first barrier material being such that, if annealed in an annealing process, the first barrier material would diffuse into the conductive material. The method further includes modifying the first barrier material on the exposed surface to form a second barrier material, the second barrier material being such that, during an annealing process, the second barrier material does not diffuse into the conductive material and depositing a second layer of the first barrier material along the sidewalls of the opening. Still further, the method includes annealing the semiconductor substrate. Integrated circuits fabricated in accordance with the foregoing method are also disclosed.

20 Claims, 4 Drawing Sheets

HYBRID MANGANESE AND MANGANESE NITRIDE BARRIERS FOR BACK-END-OF-LINE METALLIZATION AND METHODS FOR FABRICATING THE SAME

TECHNICAL FIELD

The present disclosure generally relates to integrated circuits and methods for fabricating integrated circuits. More particularly, the presented disclosure relates to hybrid manganese (Mn) and manganese nitride ($MnN_x$) barriers for back-end-of-line (BEOL) metallization and methods for fabricating such hybrid barriers.

BACKGROUND

The majority of present day integrated circuits are implemented by using a plurality of interconnected field effect transistors (FETs), also called metal oxide semiconductor field effect transistors (MOSFETs), or simply MOS transistors. An MOS transistor includes a gate electrode as a control electrode formed over a semiconductive substrate, and spaced apart source and drain electrodes within the substrate between which a current can flow. A control voltage applied to the gate electrode controls the flow of current through a channel in the semiconductive substrate between the source and drain electrodes. Dielectric materials, such as silicon dioxide, are commonly employed to electrically separate the various gate electrodes in the integrated circuit.

Due to the large number of circuit elements and the required complex layout of advanced integrated circuits, the electrical connections of the individual circuit elements are generally not established within the same level on which the circuit elements are manufactured. Such electrical connections are formed in one or more additional "wiring" layers, also referred to as metallization layers. These metallization layers generally include metal-containing lines, providing the intra-level electrical connection, and a plurality of inter-level connections, also referred to as vias, which provide the electrical connection between two neighboring stacked metallization layers. The metal-containing lines and vias may also be commonly referred to as interconnect structures.

Due to the ongoing demand for shrinking the feature sizes of highly sophisticated semiconductor devices, highly conductive metals, such as copper and alloys thereof, in combination with low-k dielectric materials, have become frequently used alternatives in the formation of metallization layers. A plurality of metallization layers stacked on top of each other is employed to realize the connections between all internal circuit elements and I/O (input/output), power and ground pads of the circuit design under consideration. For extremely scaled integrated circuits, such as the 32 nm scale and smaller, the signal propagation delay, and thus the operating speed, of the integrated circuit may no longer be limited by the field effect transistors but may be restricted, owing to the increased density of circuit elements requiring an even more increased number of electrical connections, by the close proximity of the metal lines, since the line-to-line capacitance is increased, which is accompanied by the fact that the metal lines have a reduced conductivity due to a reduced cross-sectional area.

During the formation of copper-based metallization layers, a so-called damascene or inlaid technique may be used, due to copper's characteristic resistance to forming volatile etch products when being exposed to well-established anisotropic etch ambients. In addition, copper also may not be deposited with high deposition rates on the basis of well-established deposition techniques usually used for aluminum, such as chemical vapor deposition (CVD). Thus, in the inlaid technique, the dielectric material, such as a silicon oxide, is patterned to receive trenches and/or vias, which are subsequently filled with the copper by an electrochemical deposition technique. Moreover, a barrier layer may be formed on exposed surface portions of the dielectric material prior to filling in the metal, which provides the desired adhesion of the copper to the surrounding dielectric material and also suppresses copper diffusion into sensitive device areas, as copper may readily diffuse in a plurality of dielectric materials, in particular in porous low-k dielectrics.

Manganese has found substantial utility as the barrier layer to be formed prior to filling in the metal. Manganese formed on the exposed surface portions of the silicon oxide dielectric material will form a manganese silicate material during subsequent annealing processes, consuming some space of the silicon oxide dielectric material and thus leaving more volume for the copper to increase the aforementioned copper line conductivity. However, at the bottom of the trenches, where the underlying metallization (copper) layer is exposed, manganese is unable to perform its desired barrier function as the manganese readily diffuses into the copper during the subsequent annealing process. The lack of a barrier material at the underlying metallization layer may result in conductivity problems between the inter-level connection structures and the underlying metallization layer.

As an alternative to a manganese barrier layer, a manganese nitride ($MnN_x$) barrier layer has been proposed. Manganese nitride has a benefit in that it will not diffuse into the underlying metallization layer upon application (and annealing) thereover. However, manganese nitride will not form the manganese silicate material along the exposed surface portions of the silicon oxide dielectric material, thus leaving less room for the metal inter-level connection and consequently a lower conductivity and increased line resistance.

Accordingly, it is desirable to provide improved methods for fabricating integrated circuits using damascene process flows. Additionally, it is desirable to provide such methods that provide increased volume for inter-level metal connection structures while simultaneously preventing electrical conductivity problems between the inter-level connection structures and the underlying metallization layer. Furthermore, other desirable features and characteristics of the present disclosure will become apparent from the subsequent detailed description and the appended claims, taken in conjunction with the accompanying drawings and the foregoing technical field and background.

BRIEF SUMMARY

Various exemplary integrated circuits and methods for fabricating integrated circuits are provided herein. In one exemplary embodiment, a method for fabricating an integrated circuit includes providing a conductive material overlying a semiconductor substrate and a dielectric material overlying the conductive material, wherein an opening exposes a surface of the conductive material and sidewalls of the dielectric material and selectively depositing a first layer of a first barrier material on the surface of the conductive material with the sidewalls of the dielectric material remaining exposed, the first barrier material being such that, if annealed in an annealing process, the first barrier material would diffuse into the conductive material. The method further includes modifying the first barrier material on the exposed surface to form a second barrier material, the second barrier material being such that, during an annealing process, the second barrier material does not diffuse into the conductive material and depositing a second layer of the first barrier material along the sidewalls of the opening. Still further, the method includes annealing the semiconductor substrate.

In another exemplary embodiment, an integrated circuit includes a semiconductor substrate, an electrical device on the semiconductor substrate, and a copper metallization layer over the electrical device. The integrated circuit further includes a silicon oxide dielectric material layer over the metallization layer, the dielectric material layer having an opening therein including a bottom portion and sidewalls and a manganese nitride layer at the bottom portion of the opening and in abutting contact with the metallization layer. Still further, the integrated circuit includes a manganese silicate layer along the sidewalls and a copper interconnect structure filling the opening and in abutting contact with the manganese nitride layer and the manganese silicate layer.

In yet another exemplary embodiment, a method for fabricating an integrated circuit includes providing a conductive material overlying a semiconductor substrate and a dielectric material overlying the conductive material, wherein an opening exposes a surface of the conductive material and sidewalls of the dielectric material and selectively depositing a first layer of a manganese metal barrier material on the exposed surface of the opening but not on the sidewalls of the opening. The method further includes modifying the manganese barrier material on the exposed surface to form a manganese nitride barrier material, depositing a second layer of the manganese barrier material along the sidewalls of the opening, and annealing the semiconductor substrate to form a manganese silicate material along the sidewalls of the opening.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following detailed description is merely illustrative in nature and is not intended to limit the embodiments of the subject matter or the application and uses of such embodiments. Furthermore, there is no intention to be bound by any expressed or implied theory presented in the preceding technical field, background, brief summary or the following detailed description.

Embodiments of the present disclosure are directed to integrated circuits and methods for fabricating integrated circuits, and in particular the present disclosure relates to hybrid manganese (Mn) and manganese nitride ($MnN_x$) barriers for back-end-of-line (BEOL) metallization and methods for fabricating such hybrid barriers. In contrast to depositing either a Mn or a $MnN_x$ barrier layer, both of which as noted above have inherent advantages and disadvantages, the described embodiments employ selective deposition of Mn followed by nitridation to deposit a $MnN_x$ barrier on the metal line to prevent diffusion of the barrier, followed by a deposition of Mn on the sidewalls of the dielectric via/trench to take advantage of its capacity to form manganese silicate during subsequent annealing steps. This hybrid approach increases device performance and reduces process variability and defects.

For the sake of brevity, conventional techniques related to semiconductor device fabrication may not be described in detail herein. Moreover, the various tasks and process steps described herein may be incorporated into a more comprehensive procedure or process having additional steps or functionality not described in detail herein. In particular, various steps in the manufacture of semiconductor based transistors are well known and so, in the interest of brevity, many conventional steps will only be mentioned briefly herein or will be omitted entirely without providing the well-known process details.

Figure 1:
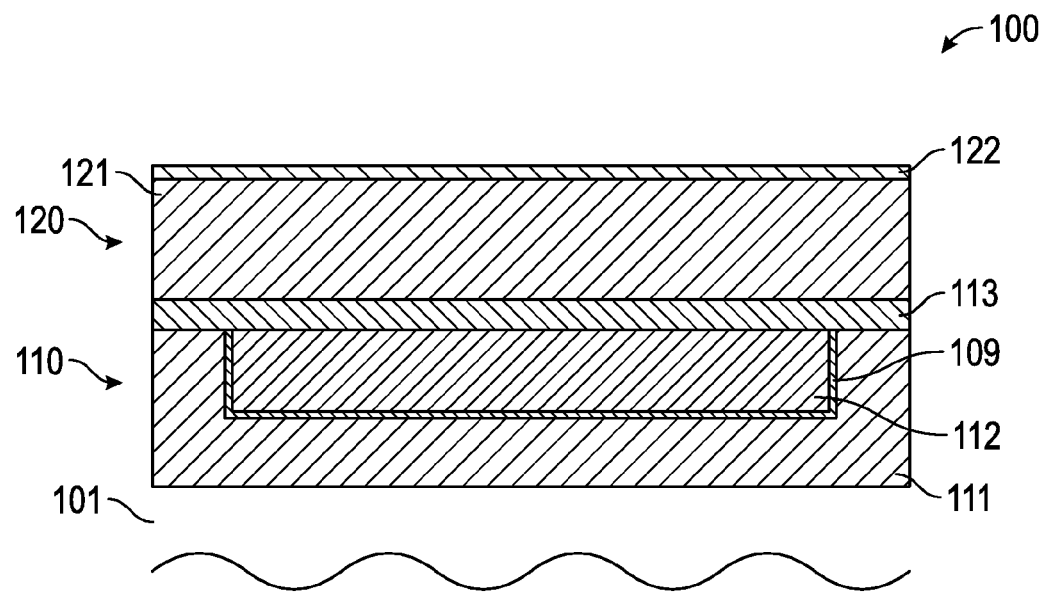
FIGS. 1-7 illustrate, in cross section, integrated circuit structures and methods for fabricating integrated circuits in accordance with various embodiments of the present disclosure.

FIG. 1 schematically illustrates a cross-sectional view of a portion of a partially-formed integrated circuit 100 in an advanced manufacturing stage, in which one or more metallization layers are to be formed above a device level of the portion 100. In the manufacturing stage shown, the semiconductor device 100 includes a substrate 101, which, for convenience, is to be considered as an appropriate carrier material having formed thereon one or more material layers for receiving semiconductor electrical device, such as transistors, capacitors, resistors and the like, which, for convenience, are not shown in FIG. 1. For instance, the substrate 101 may represent a semiconductor material, for example, a silicon material in combination with an appropriate silicon-based layer in and above which transistor elements may be formed. In other cases, a buried insulating layer (not shown) may be formed between the substrate material and the corresponding "active" silicon-based material layer, thereby providing a silicon-on-insulator (SOI) configuration. The circuit elements provided in the device level of the semiconductor device 100 may have critical dimensions of approximately 50 nm or less, approximately 32 nm or less, or approximately 22 nm or less, depending on the device requirement.

Above the substrate 101, and above the non-illustrated semiconductor circuit elements, a metallization system is provided which may be represented by a first metallization layer 110 including a dielectric material 111, which may be provided in the form of a conventional dielectric material, such as silicon dioxide, silicon nitride, silicon oxynitride and the like, depending on the overall device and process requirements. In some applications, the dielectric material 111 may include a low-k dielectric material (i.e., at or below the dielectric constant of silicon dioxide) to reduce the overall parasitic capacitance between adjacent metal regions. Furthermore, the metallization layer 110 may include a metal region, for instance, in the form of a metal line 112, which may include a highly conductive metal, such as copper, in combination with a barrier material 109, which in turn may include two or more layers, such as tantalum, tantalum nitride, and the like, in order to obtain the desired barrier and adhesion effect. For example, tantalum nitride may provide enhanced adhesion to the surrounding dielectric material, while tantalum may provide superior copper diffusion blocking effects while also endowing enhanced mechanical stability to the copper material of the metal region 112. The metallization layer 110 may further include a cap layer 113, which may include silicon nitride, silicon carbide, nitrogen-containing silicon carbide, and the like, wherein the cap layer 113 may act as an etch stop layer during the further processing of the device 100 and may also confine the metal line 112, for instance, in view of undue copper diffusion and any interaction of reactive components, such as oxygen or fluorine, with the highly reactive copper material in the metal line 112.

Furthermore, in the manufacturing stage shown, a further metallization layer 120 may be provided in an initial stage, that is, a dielectric material 121 is provided with appropriate material characteristics and a desired thickness so as to receive a via opening and a trench in a subsequent manufacturing stage. For instance, in some applications, the dielectric material 121 may include a silicon oxide material having a reduced density, for instance, provided by a porous structure so as to obtain moderately low values for the dielectric constant, as may be required for further reducing the overall signal propagation delay in the metallization system of device 100. A hardmask material layer 122 formed of titanium nitride or the like may be provided over the dielectric material 121 to protect the underlying dielectric material 121 during subsequent processing steps.

The device 100 as shown in FIG. 1 may be formed on the basis of well-established process techniques. For example, the circuit elements (not shown) may be formed on the basis of well-established process techniques so as to obtain the circuit elements with feature sizes as required by design rules of the technology node under consideration. After forming an appropriate contact structure (not shown), that is, an interlayer dielectric material having a planarized surface topography for enclosing and passivating the circuit elements, including appropriate conductive elements connecting to contact areas of the circuit elements, the metallization layers 110, 120 may be formed. For this purpose, the dielectric material 111 may be deposited and may be subsequently patterned to receive vias and/or trenches, followed by the deposition of the barrier material 109, which may be accomplished by sputter deposition, chemical vapor deposition (CVD), and the like Thereafter, the metal, such as copper, may be filled in, for instance, by electroplating, where, prior to the electrochemical deposition process, a conductive seed layer, such as a copper layer, may be formed by appropriate deposition techniques, such as sputter deposition, electroless plating and the like. After filling in the copper material, any excess material thereof may be removed, for instance, by electrochemical etching, chemical mechanical polishing (CMP), and the like. Next, the cap layer 113 may be formed by depositing one or more appropriate materials, such as the materials previously explained, on the basis of well-established plasma enhanced chemical vapor deposition (PECVD) techniques or the like. Subsequently, the dielectric material 121 may be formed by any appropriate deposition technique, such as CVD, spin-on processes, and the like, which may be accompanied by further reducing the relative permittivity of the material 121 by a subsequent treatment so as to create enhanced porosity therein, for instance, by incorporating an appropriate material, so-called porogens, which may result in enhanced porosity after treating the material 121, for instance, by heat, radiation, and the like. For this purpose, well-established process recipes are available. It should be appreciated that the metallization layer 110 may be formed by similar process techniques depending on the overall process strategy. Thereafter, the hardmask layer 122 may be deposited using well-known deposition techniques.

Figure 2:
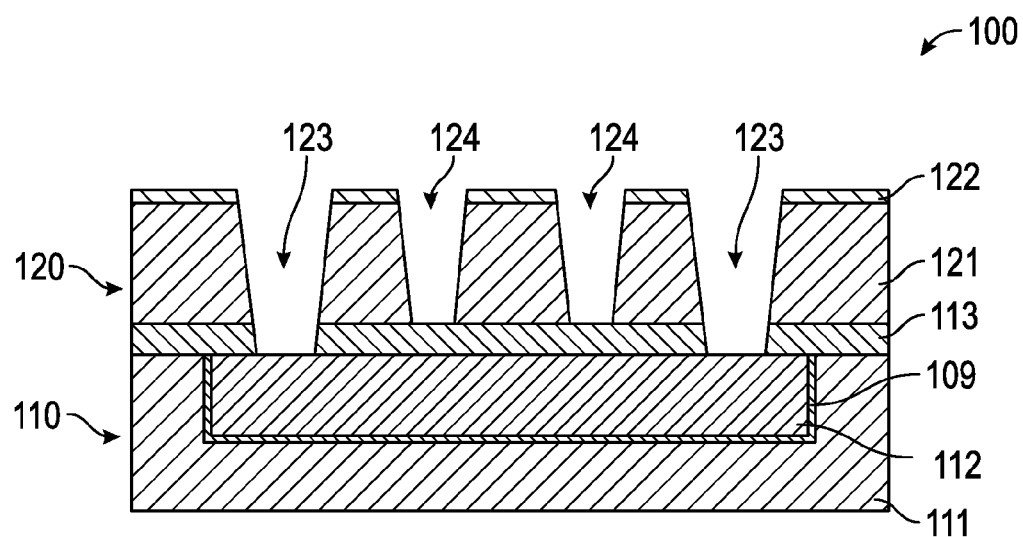

FIG. 2 schematically illustrates the semiconductor device 100 in a further advanced manufacturing stage in which a plurality of trench/via openings 123 are formed through the hardmask 122, the dielectric material 121, and the cap layer 113. (In FIG. 2 and subsequent figures, the substrate layer 101 is omitted for ease of illustration.) Other, shallower openings 124 that extend only into a portion of the dielectric material layer 121 may further be provided. For this purpose, patterning regimes are typically applied, which involve the deposition of any appropriate materials, such as anti-reflective coating (ARC) materials, resist materials, and the like, which may then be lithographically patterned to form an appropriate etch mask for a subsequent anisotropic etch process. Suitable anisotropic etch processes include, for example, reactive ion etching (RIE). Where RIE is employed as the etching process, a suitable "post-clean" process may additionally be employed using, for example, a dilute wet etchant such as dilute hydrofluoric acid (dHF). As a result of the etching process, a portion of the copper metal line 112 is exposed, namely the portion thereof at the bottom of the openings 123.

With the copper metal line 112 exposed, manganese (Mn) may be selectively deposited on the exposed copper at the bottom of the openings 123 using, for example, CVD, while avoiding any deposition of the manganese on the dielectric material 121. For example, this selective deposition may be performed using a manganese amidinate as the manganese precursor for the CVD process, such as bis(N,N'-diisopropylpentanamidinato)manganese(II), having the following chemical formula:

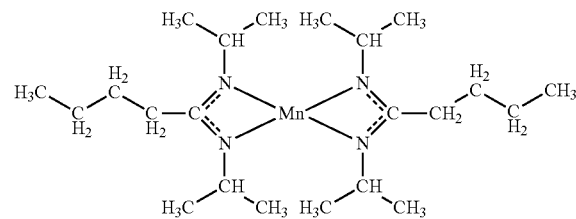

Figure 3:
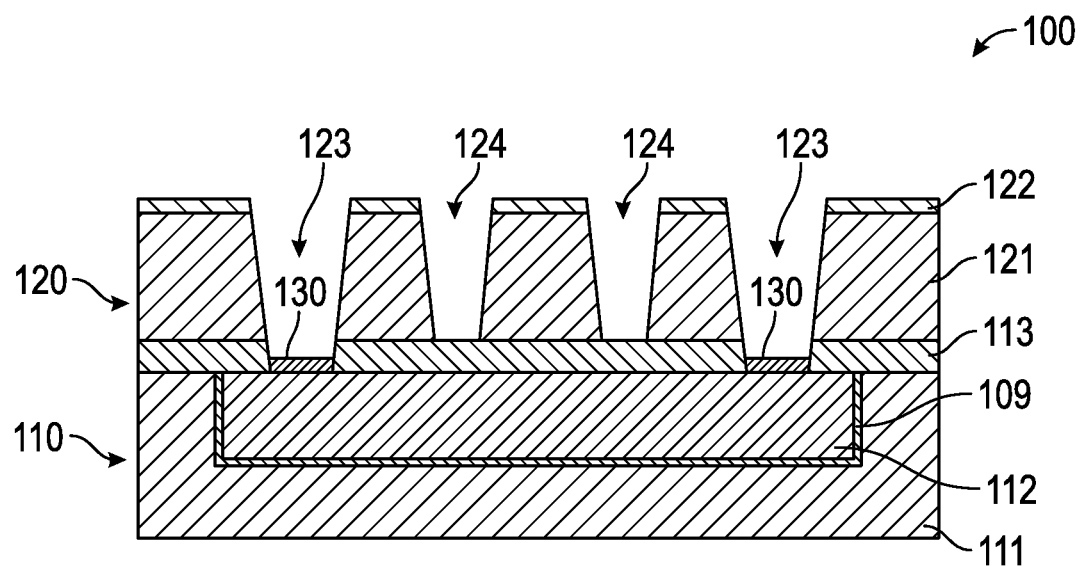

The manganese precursor may be provided to the CVD reactor in gaseous form at about 90° C. along with a flow of highly purified nitrogen. For the deposition of manganese on the copper line 112, the CVD reactor temperature may be controlled at a deposition temperature of about 300° C., and the pressure may be maintained at about 5 Torr. Deposition may be performed for a time period of about 1 minute to about one hour, depending on the thickness of manganese desired to be deposited, which may be from about 1 nm to about 5 nm, in some embodiments. FIG. 3 illustrates the result of the selective manganese deposition process, showing a manganese layer 130 formed in the openings 123 over the copper line 112, while leaving the silicon oxide dielectric material 121 exposed.

Figure 4:
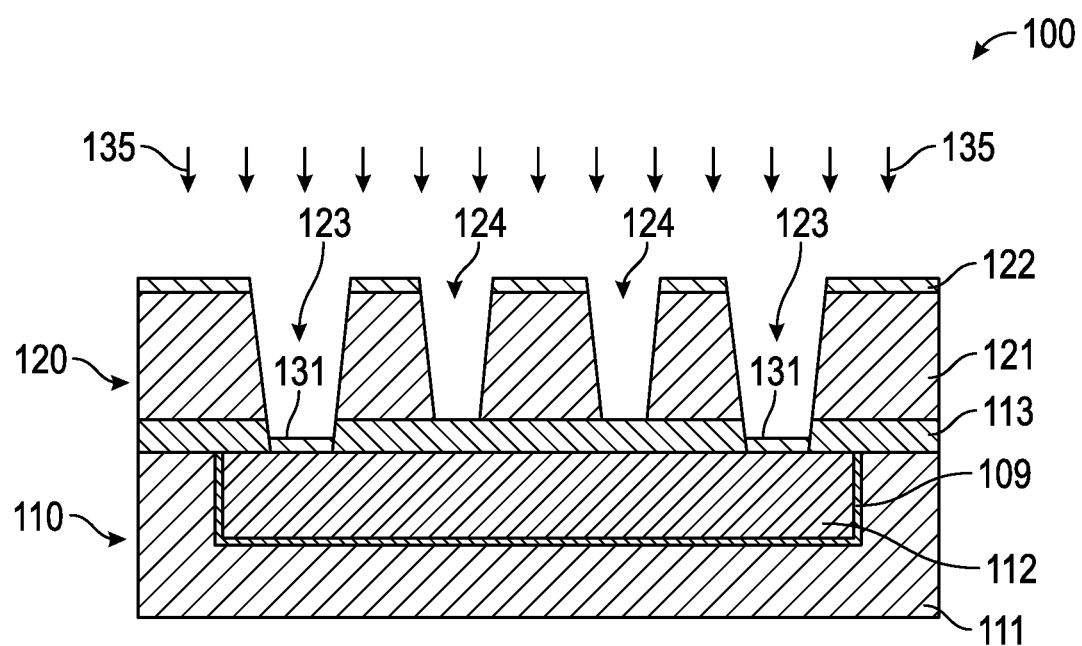

With reference now to FIG. 4, the deposited manganese may be subjected to a selective nitridation process for the formation of manganese nitride ($MnN_x$). In one embodiment, the nitridation process may include a reactive nitrogen plasma nitridation process. For example, the device 100 may be secured into a reaction chamber, and nitrogen gas ($N_2$) may be introduced into the chamber at a suitable flow rate. A reactive nitrogen plasma species (indicated by arrows 135 in FIG. 4) may thereafter be generated by supplying a plasma-generating power source of, for example, about 30 Watts or greater. The temperature in the reaction may be maintained at about 100 to about 400° C., and the pressure within the reaction chamber may be maintained at about $1 \times 10^{-4}$ to about 1 Torr. As a result of the nitridation process, the deposited manganese is converted to $MnN_x$ material 131, and any nitridation of the silicon oxide material 121 is substantially avoided.

Figure 5:
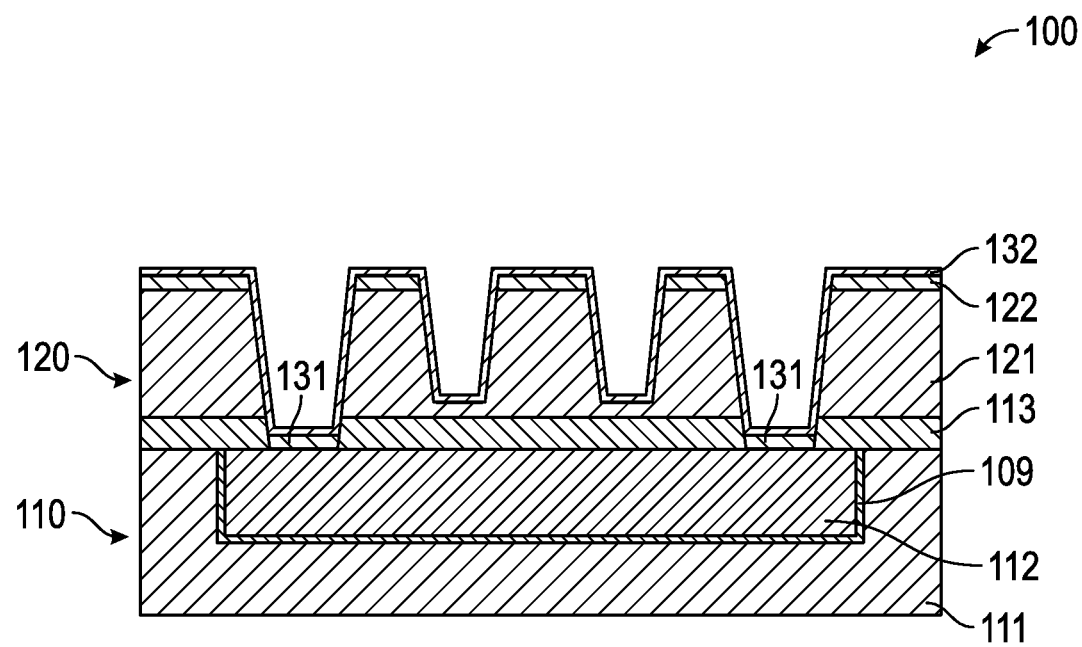
Figure 6:
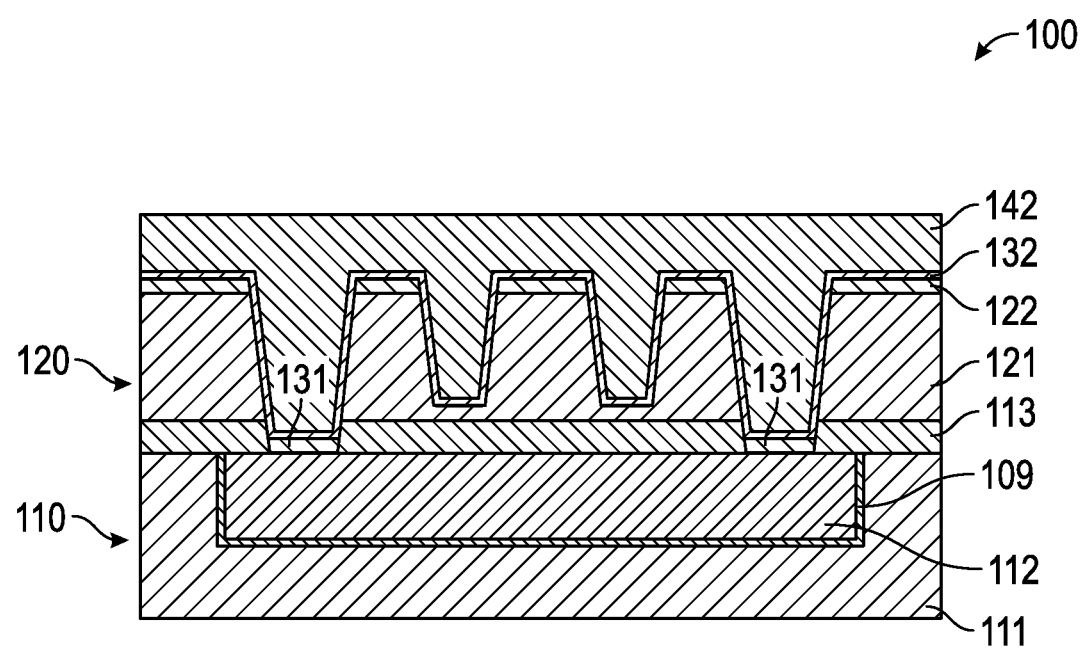

After formation of the manganese nitride material 131, a layer of manganese 132 may be conformally deposited within the openings 123 and 124, so as to form a uniform thickness layer of manganese over the manganese nitride 131, the cap layer 113, dielectric layer 121, and the hard mask 122, as shown in FIG. 5. Mn may be deposited by any convenient method, including chemical and physical methods. Chemical methods include chemical vapor deposition (CVD) and atomic layer deposition (ALD). Physical methods include sputtering and evaporation. Subsequently, as shown in FIG. 6, a conductive metal 142, such as copper, may be filled into the openings 123, 124, for instance, by electroplating, where, prior to the electrochemical deposition process, a conductive seed layer, such as a copper layer, may be formed by appropriate deposition techniques, such as sputter deposition, electroless plating and the like.

Figure 7:
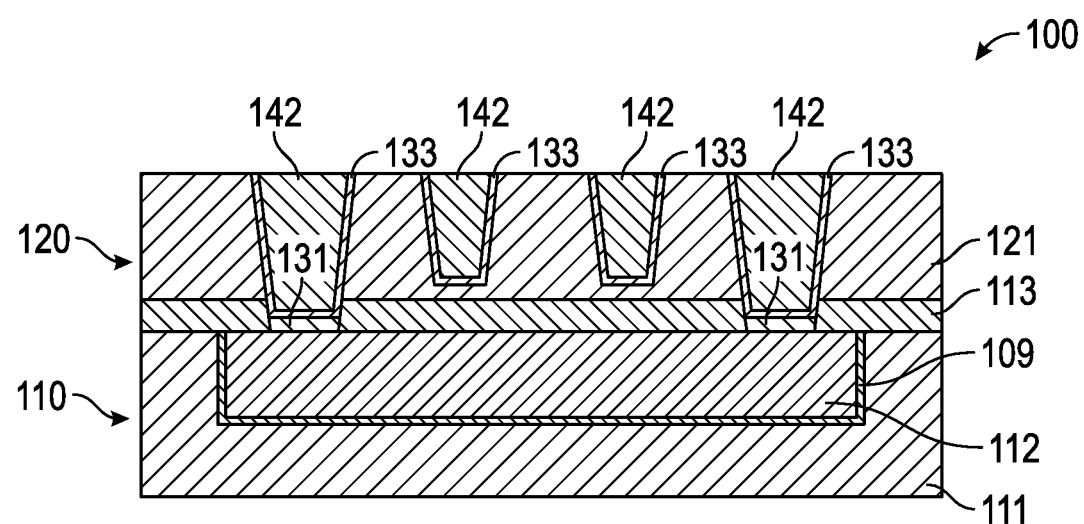

As noted above, manganese 132 formed on the exposed surface portions of the silicon oxide dielectric material 121 will form a manganese silicate material during subsequent annealing processes, consuming some space of the silicon oxide dielectric material and thus leaving more volume for the copper to increase the aforementioned copper line conductivity. Copper, at the annealing temperatures, fills the volume consumed. FIG. 7 illustrates the result of such an anneal process, which may be performed in any conventional manner, for example, at a temperature of greater than about 500° C. and for a time period of greater than about 30 minutes. As a result of the annealing, the manganese layer 132 reacts with the silicon oxide material 121 and forms a manganese silicate layer 133. Additionally, as initially noted, the manganese nitride 131 (unlike Mn metal) does not diffuse into the copper line 112 as a result of the annealing, and remains substantially in place. After annealing, as further shown in FIG. 7, any excess material, such as excess copper 142, in addition to the hard mask material 122 and any Mn 132 deposited on the hard mask 122, may be removed, for instance, by electrochemical etching, chemical mechanical polishing (CMP), and the like.

Although not illustrated, the partially-formed integrated circuit is completed in a conventional manner by, for example, providing electrical contacts to electrical devices, depositing other interlayer dielectrics, etching further contact vias, filling the further contact vias with conductive plugs, and the like as are well known to those of skill in the art of fabricating integrated circuits. Additional post-processing may include the formation of further metal and interlayer dielectric layers therebetween to complete the various electrical connections in the integrated circuit. The present disclosure is not intended to exclude such further processing steps as are necessary to complete the fabrication of a functional integrated circuit, as are known in the art.

While at least one exemplary embodiment has been presented in the foregoing detailed description of the disclosure, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing an exemplary embodiment of the disclosure. It being understood that various changes may be made in the function and arrangement of elements described in an exemplary embodiment without departing from the scope of the disclosure as set forth in the appended claims.

What is claimed is:

1. A method for fabricating an integrated circuit comprising:
   providing a conductive material overlying a semiconductor substrate and a dielectric material overlying the conductive material, wherein an opening exposes a surface of the conductive material and sidewalls of the dielectric material;
   selectively depositing a first layer of a first barrier material on the surface of the conductive material with the sidewalls of the dielectric material remaining exposed, the first barrier material being diffusible into the conductive material at annealing temperatures;
   modifying the first barrier material on the surface to form a second barrier material, the second barrier material being non-diffusable into the conductive material at annealing temperatures;
   depositing a second layer of the first barrier material along the sidewalls of the opening; and
   annealing the semiconductor substrate.

2. The method of claim 1, wherein providing the semiconductor substrate comprises forming the dielectric material over a metallization layer and etching the opening in the dielectric material layer to expose the metallization layer.

3. The method of claim 2, wherein forming the dielectric material comprises forming a silicon oxide material.

4. The method of claim 3, wherein etching the opening comprises exposing a copper metal inner-layer connection line.

5. The method of claim 3, wherein selectively depositing the first layer of the first barrier material comprises selectively depositing a manganese metal.

6. The method of claim 5, wherein selectively depositing the manganese metal comprises performing a chemical vapor deposition process using a manganese amidinate precursor.

7. The method of claim 5, wherein modifying the first barrier material comprises nitriding the manganese metal.

8. The method of claim 7, wherein nitriding the manganese metal comprises exposing the manganese metal to a nitrogen-containing plasma.

9. The method of claim 5, wherein depositing the second layer of the first barrier material comprises depositing a manganese metal.

10. The method of claim 9, wherein annealing the semiconductor substrate comprises forming a manganese silicate material on the sidewalls of the opening as a result of a reaction between the manganese metal deposited thereon and the silicon oxide dielectric material.

11. The method of claim 2, further comprising forming a layer of the conductive material so as to fill the opening prior to annealing the semiconductor substrate.

12. The method of claim 11, wherein forming the layer of the conductive material comprises forming a layer of copper metal.

13. The method of claim 12, further comprising polishing the layer of the conductive material subsequent to annealing the semiconductor substrate.

14. The method of claim 2, wherein providing the semiconductor substrate comprises providing a semiconductor substrate having one or more of a transistor or resistor structure formed thereon.

15. The method of claim 14, wherein providing the semiconductor substrate comprises providing a semiconductor substrate with the one or more of the transistor or resistor structure formed under the metallization layer.

16. A method for fabricating an integrated circuit comprising:
   providing a conductive material and a dielectric material overlying the conductive material, wherein an opening exposes a surface of the conductive material and sidewalls of the dielectric material;
   selectively depositing a first layer of a manganese metal barrier material on the exposed surface of the opening but not on the sidewalls of the opening;
   modifying the manganese barrier material on the exposed surface to form a manganese nitride barrier material;
   depositing a second layer of the manganese barrier material along the sidewalls of the opening; and
   annealing the semiconductor substrate to form a manganese silicate material along the sidewalls of the opening.

17. The method of claim 16, wherein the semiconductor substrate is a bulk silicon substrate.

18. The method of claim 16, wherein the semiconductor substrate is a silicon-on-insulator substrate.

19. The method of claim 16, wherein a cap layer is disposed between a portion of the metallization layer and the dielectric material layer.

20. An integrated circuit structure comprising:
  a semiconductor substrate;
  an electrical device overlying the semiconductor substrate;
  a copper metallization layer over the electrical device;
  a silicon oxide dielectric material layer overlying the metallization layer, the dielectric material layer having an opening therein comprising a bottom portion and sidewalls;
  a manganese nitride layer at the bottom portion of the opening and in abutting contact with the metallization layer;
  a manganese silicate layer along the sidewalls; and
  a copper interconnect structure filling the opening and in abutting contact with the manganese nitride layer and the manganese silicate layer.

\* \* \* \* \*